United States Patent
Wang et al.

(10) Patent No.: US 10,686,079 B1
(45) Date of Patent: Jun. 16, 2020

(54) FIN FIELD EFFECT TRANSISTOR STRUCTURE WITH PARTICULAR GATE APPEARANCE

(71) Applicant: UNITED MICROELECTRONICS CORP., Hsin-Chu (TW)

(72) Inventors: Chih-Yi Wang, Tainan (TW); Cheng-Pu Chiu, New Taipei (TW); Huang-Ren Wei, Tainan (TW); Tien-Shan Hsu, Tainan (TW); Chi-Sheng Tseng, Tainan (TW); Yao-Jhan Wang, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 16/243,014

(22) Filed: Jan. 8, 2019

(30) Foreign Application Priority Data

Dec. 12, 2018 (CN) .......................... 2018 1 1516618

(51) Int. Cl.
| | |
|---|---|
| *H01L 29/76* | (2006.01) |
| *H01L 29/78* | (2006.01) |
| *H01L 29/423* | (2006.01) |
| *H01L 29/66* | (2006.01) |
| *H01L 29/49* | (2006.01) |
| *H01L 29/417* | (2006.01) |
| *H01L 21/3213* | (2006.01) |
| *H01L 21/8234* | (2006.01) |

(52) U.S. Cl.
CPC .... *H01L 29/7856* (2013.01); *H01L 29/41791* (2013.01); *H01L 29/4238* (2013.01); *H01L 29/42376* (2013.01); *H01L 29/4916* (2013.01); *H01L 29/6681* (2013.01); *H01L 29/66545* (2013.01); *H01L 29/66795* (2013.01); *H01L 29/785* (2013.01); *H01L 29/7853* (2013.01); *H01L 21/32139* (2013.01); *H01L 21/823431* (2013.01)

(58) Field of Classification Search
CPC ............. H01L 29/7856; H01L 29/4916; H01L 29/4238; H01L 29/42376; H01L 29/66795; H01L 29/66545; H01L 21/32139; H01L 29/785; H01L 29/7853; H01L 21/823431; H01L 29/6681; H01L 29/41791
See application file for complete search history.

(56) References Cited

U.S. PATENT DOCUMENTS

| | | | | |
|---|---|---|---|---|
| 7,482,628 | B2 * | 1/2009 | Kang | .................. G02F 1/13454 |
| | | | | 257/257 |
| 8,629,512 | B2 * | 1/2014 | Liaw | .................. H01L 29/7853 |
| | | | | 257/401 |
| 9,269,813 | B2 * | 2/2016 | Hong | ..................... H01L 29/785 |
| 9,673,195 | B2 | 6/2017 | Ryoo | |
| 10,192,968 | B2 * | 1/2019 | You | ..................... H01L 29/4238 |
| 10,262,870 | B2 * | 4/2019 | Chen | ..................... H01L 29/785 |

\* cited by examiner

*Primary Examiner* — Shouxiang Hu
(74) *Attorney, Agent, or Firm* — Winston Hsu

(57) ABSTRACT

A fin field effect transistor structure with particular gate appearance is provided in this disclosure, featuring a fin on a substrate and a gate on the substrate and traversing over the fin, wherein the fin is divided into an upper portion on a top surface of the fin and a lower portion on two sides of the fin, and the lower portion of the gate has protrusions laterally protruding in said first direction at positions abutting to the fin.

14 Claims, 4 Drawing Sheets

US 10,686,079 B1

FIN FIELD EFFECT TRANSISTOR STRUCTURE WITH PARTICULAR GATE APPEARANCE

BACKGROUND OF THE INVENTION

1. Field of the Invention

The present invention generally relates to a semiconductor structure, and more specifically, relates to a fin field effect transistor (FinFET) structure with particular gate appearance.

2. Description of the Prior Art

A Metal-Oxide-Semiconductor Field-Effect Transistor (MOSFET) is a field-effect transistor widely used in analogue electronics and digital electronics with advantages of available area, operating speed, power consumption, and manufacturing cost better than conventional Bipolar Junction Transistor (BJT), therefore, are widely adopted by the industry.

As the advances of MOSFET technology, the length of gate is shrunk to below 20 nm. The problem of current leakage is increasingly serious since the source and drain are getting too close together. The shrinking of gate length also reduces the contact area of gate and channel, thereby weakening the influence of the gate to the channel. In order to solve this problem, the industry develops 3D Fin Field-Effect Transistors (FinFET) featuring the fin design to increase the contact area of gate and channel. The aforementioned problem is, therefore, solved.

In replacement metal gate (RMG) or gate last technology, the poly-Si based dummy gate or sacrificial gate would be formed in advance on the fin for shaping the gate. The dummy gate will be replaced with laminated structure such as high-k gate dielectric layer, work function layer, and one or more metal layers to form metal gate in later processes.

SUMMARY OF THE INVENTION

The present invention is to provide a fin field effect transistor (FinFET) structure with particular features at positions where gates abut fins.

One purpose of the present invention is to provide a semiconductor structure with particular gate appearance, featuring a substrate, a fin on the substrate, wherein a longitudinal direction of the fin is a first direction, and a gate on the substrate and traversing over the fin, wherein a longitudinal direction of the gate is a second direction, and the gate is divided into an upper portion on a top surface of the fin and a lower portion at two sides of the fin, and the lower portion of the gate has protrusions laterally extending in the first direction at positions abutting the fin.

Another purpose of the present invention is to provide a 3D semiconductor structure, featuring a substrate, a fin on the substrate, wherein a longitudinal direction of the fin is a first direction, and a gate on the substrate and traversing over the fin, wherein a longitudinal direction of the gate is a second direction, and the gate is divided into an upper portion on a top surface of the fin and a lower portion at two sides of the fin, and the lower portion of the gate has protrusions laterally extending in the first direction at positions abutting the fin.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute apart of this specification. The drawings illustrate some of the embodiments and, together with the description, serve to explain their principles. In the drawings.

Figure 1:
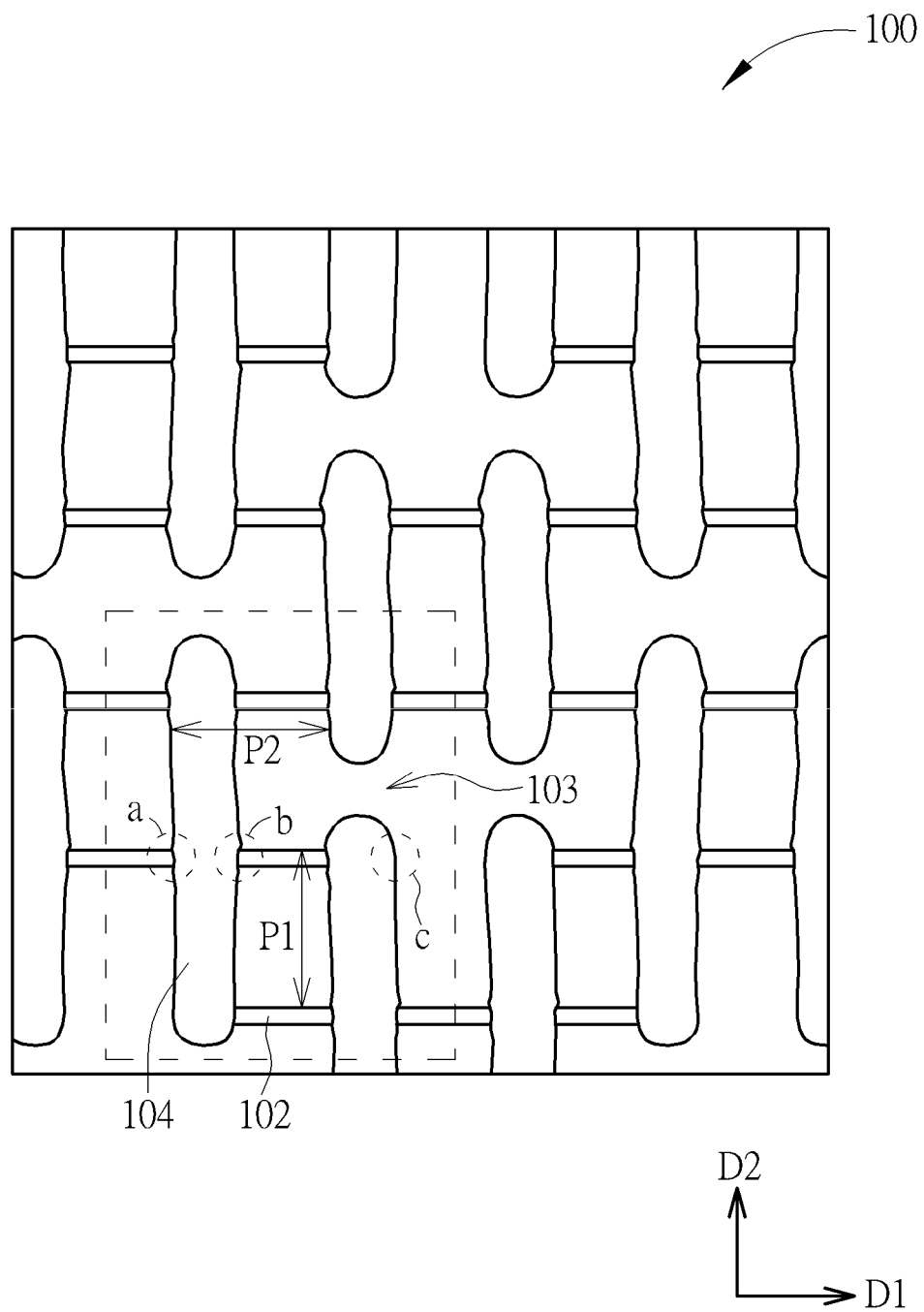
FIG. 1 is a layout of active patterns and gate patterns of Metal-Oxide-Semiconductor Field-Effect Transistor (MOSFET) in accordance with the preferred embodiment of the present invention.

It should be noted that all the figures are diagrammatic. Relative dimensions and proportions of parts of the drawings have been shown exaggerated or reduced in size, for the sake of clarity and convenience in the drawings. The same reference signs are generally used to refer to corresponding or similar features in modified and different embodiments.

DETAILED DESCRIPTION

In the following detailed description of the invention, reference is made to the accompanying drawings, which form a part hereof, and in which is shown, by way of illustration, specific embodiments in which the invention may be practiced. These embodiments are described in sufficient detail to enable those skilled in the art to practice the invention. Other embodiments may be utilized and structural, logical and electrical changes may be made without departing from the scope of the present invention. The following detailed description is, therefore, not to be taken in a limiting sense, and the scope of the present invention is defined only by the appended claims, along with the full scope of equivalents to which such claims are entitled.

Please refer to FIG. 1 first, which is a layout of active patterns and gate patterns of a Metal-Oxide-Semiconductor Field-Effect Transistor (MOSFET) in accordance with the preferred embodiment of the present invention. In the exemplary design architecture of CMOS integrated circuit, the substrate 100 on the layout area will be defined with p-well (not shown) doped with p-type dopants corresponding to an NMOS transistor and n-well (not shown) doped with n-type dopants corresponding to a PMOS transistor. Since the well region mentioned above is not essential feature of the present invention, they are not shown in the figure in case of obscuring the key point of the present invention.

As shown in FIG. 1, linear active patterns 102, such as fin patterns, are defined on a corresponding p-well region or n-well region with identical pitch P1 and extending in a first direction D1. The pitch P1 is the shortest distance between a first side of a fin 102 and a first side of an adjacent fin 102. Furthermore, a plurality of gate patterns 104 are defined on the substrate 100 and traverses over the linear active patterns 102. The gate patterns 104 generally have identical pitch P2 and extend in a second direction D2, wherein the second direction D2 is usually perpendicular to the first direction D1, and the pitch P1 might be the same as the pitch D2. Alternatively, the pitch P1 might be different from the pitch P2. Please note that adjacent linear active patterns 102 in a row may be provided with slot cut regions 103 separating therebetween. The linear active patterns 102 and the gate patterns 104 may be defined by photolithographic processes.

In actual structure, the gate pattern 104 may include a gate oxide layer (not shown) and a conductive layer (not shown) formed on the gate oxide layer. The gate pattern 104 functions as a gate electrode for a PMOS transistor or a NMOS transistor. The linear active patterns 102 at two sides of the gate pattern 104 are usually formed with a source and drain, such as doped epitaxial SiGe structures. Insulating interlayers (not shown) are further formed on the linear active patterns 102 and the gate patterns 104. Contacts (not shown) are formed in these insulating interlayers and are electrically connected with underlying gate patterns 104 or source/drain to interconnect to other circuit. Except for the gate patterns 104, the aforementioned components will not be shown in the figures in case of obscuring the key points of the present invention.

Figure 2:
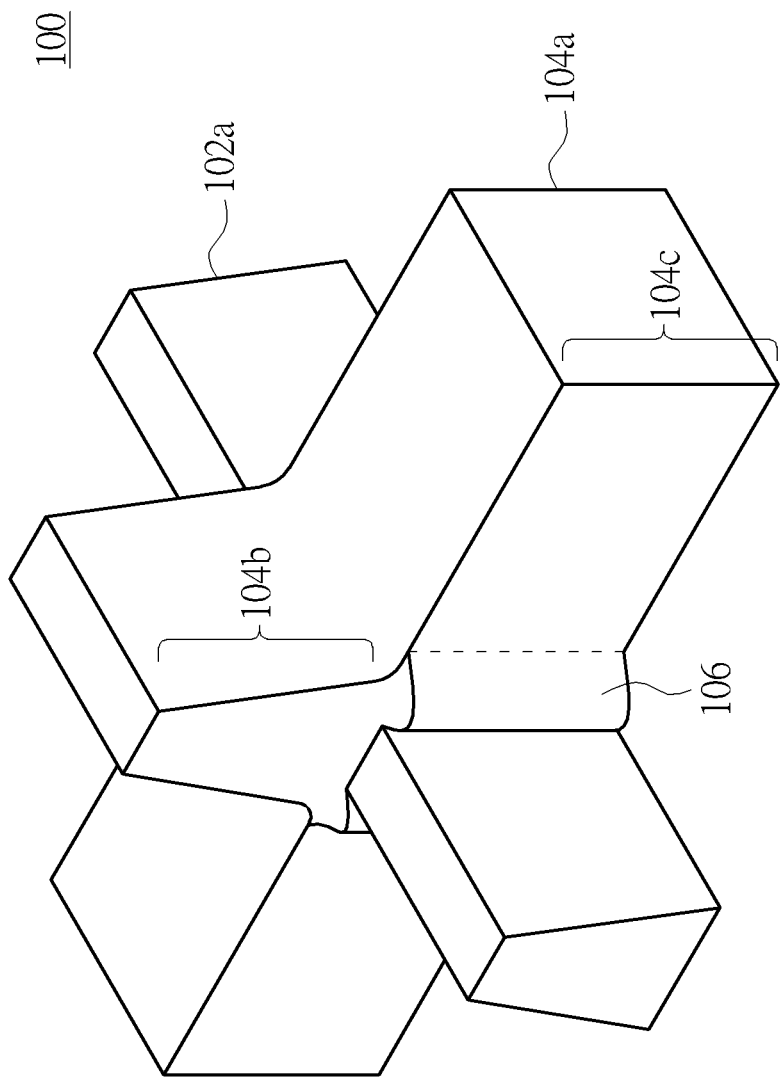
FIG. 2 is a perspective drawing of the fin field effect transistor (FinFET) structure with particular gate appearance in accordance with the preferred embodiment of the present invention.

Please refer to FIG. 2, which is a perspective drawing of the fin field effect transistor (FinFET) structure with particular gate appearance in accordance with the preferred embodiment of the present invention. The structural portion shown in FIG. 2 is exactly the portion shown by dashed circles in FIG. 1, wherein a gate 104a is shown traversing over a fin 102a. The gate 104a and the fin 102a are defined respectively by the gate pattern 104 and the linear active pattern 102 shown in FIG. 1. For example, performing an etch process to a material layer (ex. silicon or poly-silicon layer, respectively) using a photoresist or hard mask with the gate patterns 104 or linear active patterns 102 as an etch mask to form the patterns. In replacement metal gate (RMG) or gate last technology, the gate 104a may be a dummy gate or sacrificial gate that is formed in advance on the fin for shaping the gate. The dummy gate will be replaced with laminated structure such as high-k gate dielectric layer, work function layer, and one or more metal layer to form metal gate in later processes. Like FIG. 1, the aforementioned components will not be shown in the figures except for the gate pattern 104 and the fin 102a in case of obscuring the key points of the present invention.

As shown in FIG. 2, the fin 102a protrudes from the substrate 100 and extends in a longitudinal first direction D1. The gate 104a is disposed on the substrate 100 and extends in a longitudinal second direction D2. The second direction D2 is preferably perpendicular to the first direction D1, but not limited thereto. In the embodiment of the present invention, the gate 104a is divided into an upper portion 104b on a top surface of the fin 102a and a lower portion 104c at two sides of the fin 102a, wherein, due to the effect of etch process, the width of gate 104a in the second direction D2 tapers from the lower portion 104c to the upper portion 104b. Similarly, the width of gate 104a in the first direction D1 tapers from the lower portion 104c to the upper portion 104b. The fin 102a is also provided with this kind of tapering feature.

Please note that, as shown in FIG. 2 in the embodiment of the present invention, the lower portion 104c of the gate 104a has protrusions 106 feature laterally extending in the first direction D1 at positions abutting the fin 102a. The upper portion 104b of the gate 104a that does not abut with the fin 102a will not be provided with this kind of protrusion feature. This feature may also be observed in FIG. 1. It can be seen that the positions where the gate patterns 104 and the linear active patterns 102 abutting are all provided with this kind of protrusions 106 feature.

Furthermore, as shown in FIG. 1, it can be seen that some gate patterns 104 in the figure have only one side abutting with the linear active pattern 102 (i.e. the fin). As the portion "c" shown in the figure, the sides of these gate patterns 104 that do not abut with the linear active patterns 102 are not provided with this protrusions 106 feature. Only the side abutting with the linear active pattern 102 has protrusions 106 feature.

On the other hand, as shown in FIG. 1, many slot cut regions 103 are formed on the layout plan to separate adjacent linear active patterns 102. These regions break single linear active pattern 102 into several linear active patterns 102 in a row. It can be seen in the figure that some gate patterns 104 have a side adjacent to the slot cut region 103 and a side not adjacent to the slot cut region 103. Wherein, the protruding degree of the protrusion 106 protruding toward the adjacent slot cut region 103 would be larger than the protruding degree of the protrusion 106 on the side not adjacent to the slot cut portion. For example, as shown in FIG. 1, the protruding degree of protrusion 106 in the portion "b" would be larger than the protruding degree of protrusion 106 in the portion "a".

Figure 3:
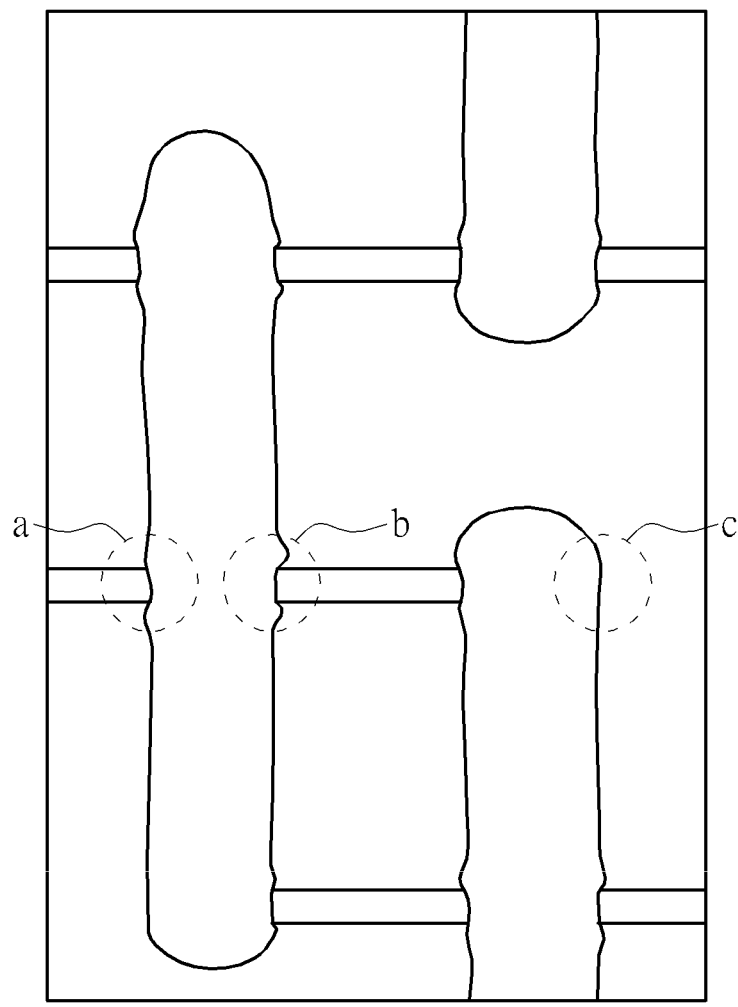
FIG. 3 is a partially enlarged drawing of the active patterns and the gate patterns in accordance with the preferred embodiment of the present invention.

FIG. 3 is a partially enlarged drawing of an area shown in the dashed frame of FIG. 1. The protrusion 106 features in the aforementioned portion "a" and portion "b" and the feature having no protrusion in the portion "c" are shown more clearly in the partially enlarged drawing of FIG. 3.

Figure 4:
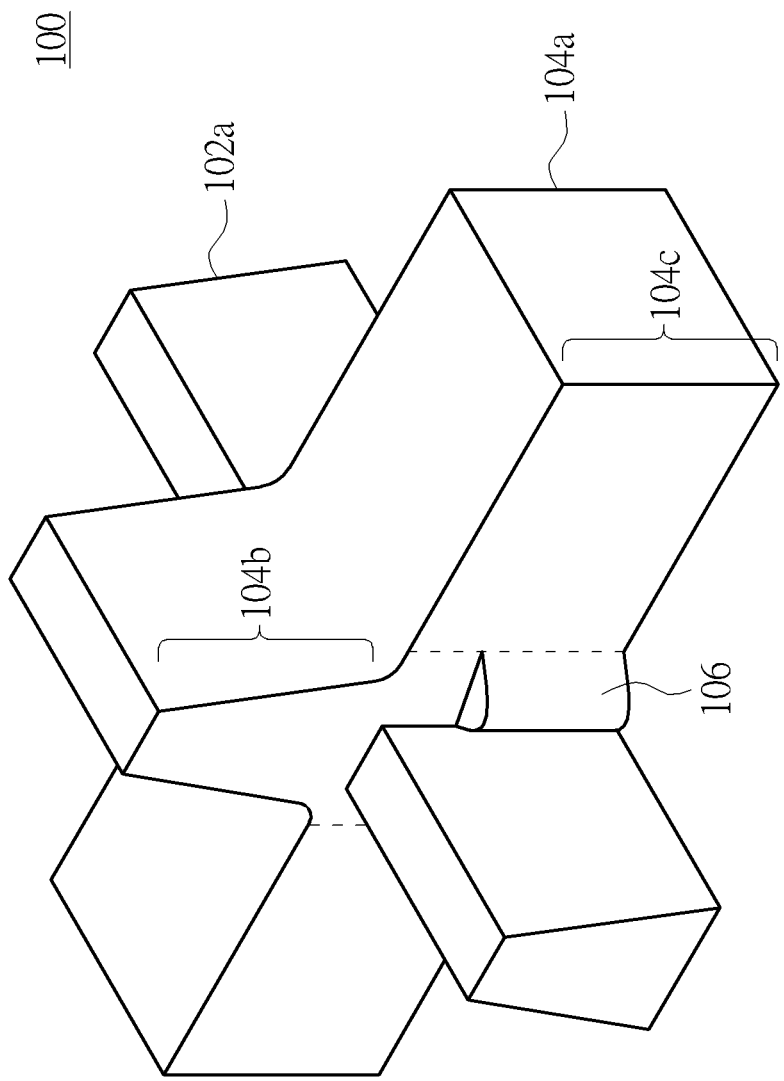
FIG. 4 is a perspective drawing of the FinFET structure with particular gate appearance in accordance with another embodiment of the present invention.

Please refer to FIG. 4, which is a perspective drawing of the FinFET structure with particular gate appearance in accordance with another embodiment of the present invention. The structure shown in the embodiment of FIG. 4 is similar to the structure shown in the embodiment of FIG. 2, with the only difference that the top surface of the protrusion 106 is not flush with the top surface of the lower portion 104c of the gate 104a like the one shown in FIG. 2. Rather, it is lower than the top surface of the lower portion 104c by a certain degree.

According to the inventive features described in previous paragraphs, the present invention also discloses a 3D semi-conductor structure, including a substrate 100, a fin 102a on the substrate 100, wherein a longitudinal direction of the fin 102a is a first direction D1, and a gate 104a on the substrate 100 and traversing over the fin 102a, wherein a longitudinal direction of the gate 104a is a second direction D2, and the gate 104a is divided into an upper portion 104b on a top surface of the fin 102a and a lower portion 104c at two sides of the fin 102a, and the lower portion 104c of the gate 104a has protrusions 106 laterally extending in the first direction D1 at positions abutting the fin 102a.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A fin field effect transistor structure with particular gate appearance, comprising:
   a substrate;
   a fin on said substrate, wherein a longitudinal direction of said fin is a first direction; and a gate on said substrate and traversing over said fin, wherein a longitudinal direction of said gate is a second direction, and said gate is divided into an upper portion on a top surface of said fin and a lower portion at two sides of said fin, and said lower portion of said gate has protrusions laterally extending in said first direction at positions abutting said fin, wherein a top surface of said protrusion is flush with a top surface of said lower portion.

2. The fin field effect transistor structure with particular gate appearance of claim 1, wherein said fin is at only one side of said gate, and said lower portion of said gate has said protrusions only at said only one side of said gate with said fin and has no said protrusions at the other side of said gate without said fin.

3. The fin field effect transistor structure with particular gate appearance of claim 1, wherein said fin is provided with broken slot cut portion, and one side of said gate is adjacent to said slot cut portion and the other side of said gate is not adjacent to said slot cut portion, and a protruding degree of one of said protrusions protruding toward adjacent said slot cut portion in said first direction is larger than a protruding degree of one of said protrusions protruding in a direction opposite to said first direction and not protruding toward adjacent said slot cut portion.

4. The fin field effect transistor structure with particular gate appearance of claim 1, wherein a width of said lower portion of said gate in said first direction is larger than a width of said upper portion of said gate in said first direction.

5. The fin field effect transistor structure with particular gate appearance of claim 1, wherein a width of said gate tapers from said lower portion to said upper portion, either in said first direction or in said second direction.

6. The fin field effect transistor structure with particular gate appearance of claim 1, wherein said gate is a dummy gate.

7. The fin field effect transistor structure with particular gate appearance of claim 1, wherein a material of said gate is poly-silicon.

8. The fin field effect transistor structure with particular gate appearance of claim 1, wherein a material of said fin is silicon.

9. A 3D semiconductor structure, comprising:
a substrate;
a fin on said substrate, wherein a longitudinal direction of said fin is a first direction; and
a gate on said substrate and traversing over said fin, wherein a longitudinal direction of said gate is a second direction, and said gate is divided into an upper portion on a top surface of said fin and a lower portion at two sides of said fin, and said lower portion of said gate has protrusions laterally extending in said first direction at positions abutting said fin, wherein a top surface of said protrusion is flush with a top surface of said lower portion.

10. The 3D semiconductor structure of claim 9, wherein said fin is at only one side of said gate, and said lower portion of said gate has protrusions only at said only one side of said gate with said fin and has no said protrusions at the other side of said gate without said fin.

11. The 3D semiconductor structure of claim 9, wherein said fin is provided with broken slot cut portion, and one side of said gate is adjacent to said slot cut portion and the other side of said gate is not adjacent to said slot cut portion, and a protruding degree of one of said protrusions protruding in said first direction toward adjacent said slot cut portion is larger than a protruding degree of one of said protrusions in a direction opposite to said first direction and not protruding toward adjacent said slot cut portion.

12. The 3D semiconductor structure of claim 9, wherein a width of said lower portion of said gate in said first direction is larger than a width of said upper portion of said gate in said first direction.

13. The 3D semiconductor structure of claim 9, wherein a width of said gate tapers from said lower portion to said upper portion, either in said first direction or in said second direction.

14. The 3D semiconductor structure of claim 9, wherein said gate is a dummy gate.

* * * * *